United States Patent
Yelehanka et al.

(10) Patent No.: US 7,060,193 B2
(45) Date of Patent: Jun. 13, 2006

(54) METHOD TO FORM BOTH HIGH AND LOW-K MATERIALS OVER THE SAME DIELECTRIC REGION, AND THEIR APPLICATION IN MIXED MODE CIRCUITS

(75) Inventors: Pradeep Yelehanka, Singapore (SG); Sanford Chu, Singapore (SG); Chit Hwei Ng, Singapore (SG); Jia Zhen, Singapore (SG); Purakh Verma, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 145 days.

(21) Appl. No.: 10/189,876

(22) Filed: Jul. 5, 2002

(65) Prior Publication Data

US 2004/0004054 A1    Jan. 8, 2004

(51) Int. Cl.
   *H01B 13/00*    (2006.01)
(52) U.S. Cl. .................. 216/13; 216/18; 216/41; 216/74; 438/689; 438/723; 438/724; 438/725; 438/587
(58) Field of Classification Search .................. 216/13, 216/18, 41, 74; 438/689, 723, 724, 725, 438/587
   See application file for complete search history.

(56) References Cited

U.S. PATENT DOCUMENTS

| 5,442,237 A * | 8/1995 | Hughes et al. ............... 257/759 |
| 5,801,916 A * | 9/1998 | New ........................ 361/321.4 |
| 5,880,018 A * | 3/1999 | Boeck et al. ................ 438/619 |
| 6,008,102 A | 12/1999 | Alford et al. ................ 438/381 |
| 6,057,202 A | 5/2000 | Chen et al. .................. 438/381 |
| 6,133,079 A * | 10/2000 | Zhu et al. .................... 438/210 |
| 6,143,646 A * | 11/2000 | Wetzel ........................ 438/637 |
| 6,258,688 B1 | 7/2001 | Tsai ............................ 438/381 |
| 6,403,415 B1 * | 6/2002 | Alers et al. ................. 438/240 |
| 6,566,260 B1 * | 5/2003 | Chooi et al. ................ 438/687 |
| 2002/0064922 A1 * | 5/2002 | Lin ............................. 438/381 |

* cited by examiner

*Primary Examiner*—Shamim Ahmed
(74) *Attorney, Agent, or Firm*—Saile Ackerman LLC; Stephen B. Ackerman

(57) ABSTRACT

A new method of provided for forming in one plane layers of semiconductor material having both high and low dielectric constants. Layers, having selected and preferably non-identical parameters of dielectric constants, are successively deposited interspersed with layers of etch stop material. The layers can be etched, creating openings there-through that can be filled with a layer of choice.

60 Claims, 3 Drawing Sheets

METHOD TO FORM BOTH HIGH AND LOW-K MATERIALS OVER THE SAME DIELECTRIC REGION, AND THEIR APPLICATION IN MIXED MODE CIRCUITS

BACKGROUND OF THE INVENTION (1) Field of the Invention

The invention relates to the fabrication of integrated circuit devices, and more particularly, to a method for the creation of passive semiconductor components and circuits at one level using selected and non-identical dielectric materials therefore.

(2) Description of the Prior Art

Semiconductor devices are typically created using numerous related processing steps for the creation of device features. After active semiconductor devices have been created, these devices are typically personalized, which can take the form of interconnecting such basic sub-functions as gate arrays or DRAM cells or the interconnecting of logic functions to create a more complex device.

In addition to creating active semiconductor devices, such as MOSFET devices and DRAM cells or logic devices, the art increasingly uses the creation of passive components such as capacitors or inductors as part of an integrated semiconductor device processing sequence. This integration of the creation of active and passive semiconductor components has the advantage of being cost-effective in addition to providing additional freedom in designing more complex semiconductor device functions.

As dimensions of advanced Integrated Circuit (IC) devices have continued to decrease, so also have the dimensions of conductors and interconnection elements, which connect and interconnect those integrated circuit devices. In particular, dimensions of conductor and interconnection elements which directly contact IC devices have typically decreased the greatest, thus becoming the smallest in dimension of conductor and interconnecting elements within advanced IC devices. These most narrow conductor and interconnection elements typically comprise the first conductor or interconnection level, which contacts an integrated circuit device. Most commonly, first conductor levels have been formed from aluminum metal or aluminum metal alloys. Most commonly, first interconnection levels (i.e. first conductive contact studs) are formed of tungsten. As IC device dimensions have decreased while simultaneously maintaining and increasing demands for performance of IC devices, it has become increasingly more important for conductor and interconnection elements within IC devices to exhibit a high level of conductivity while simultaneously showing limited susceptibility to degradative phenomena such as electromigration.

One of the major design considerations in creating complex semiconductor devices is the selection of the type of insulating material that is used for the creation therein of conductive or electrically active components, such as inductors or capacitors. A design parameter that has a critical influence on the performance of the created component is the dielectric constant k of the selected insulating material, whereby it is required in most applications to select a material having a low dielectric constant. For instance, embedding a conductive interconnect in an insulating material having a high dielectric constant causes an undesired increase in parasitic capacitance between the interconnect and the substrate.

As an example of the application of an insulating dielectric can be cited silicon oxide, that is grown by thermal oxidation or by chemical vapor deposition, having a dielectric constant in the order of 3.9, CVD oxide having a relative dielectric constant of about 4.6. The lowest possible and therefore the ideal dielectric constant is 1.0, this is the dielectric constant of a vacuum whereas air has a dielectric constant of slightly larger than 1.0. Dielectric constants of dielectric materials that can be used for intra-level or inter level dielectric material vary, typical values are for instance 4.1–4.5 for inorganic Plasma $SiO_2$, 3.5 for inorganic fluorine doped $SiO_2$ (FSG), 2.7–3.0 for Organic Polysilsequioxane (Si polymer), 2.7 for organic Benzocyclobutene (BCB), etc.

Conventionally, semiconductor device supporting features, such as layers of conductive interconnect metal or passive components, are created in one level of insulating material on one level of deposition of this material. Design requirements and the need for increased layout flexibility indicates that it is advantageous to be able to create such supporting features without the restriction that these features are created on one level of deposition of the insulating material. The invention provides method that addresses this aspect of semiconductor device creation.

U.S. Pat. No. 6,258,688 B1 (Tsai) shows a high and low polysilicon and inductor process.

U.S. Pat. No. 6,057,202 (Chen et al.) shows an inductor process.

U.S. Pat. No. 6,008,102 (Alford et al.) shows a 3D inductor process.

SUMMARY OF THE INVENTION

A principle objective of the invention is to provide a method that allows for the creation of multiple semiconductor components having different insulation requirements at one level of insulation.

Another objective of the invention is to create at one level a layer of insulating material having non-uniform dielectric constants within the layer.

In accordance with the objectives of the invention a new method of provided for forming in one plane layers of semiconductor material having both high and low dielectric constants. Layers, having selected and preferably non-identical parameters of dielectric constants, are successively deposited interspersed with layers of etch stop material. The layers can be etched, creating openings there-through that can be filled with a layer of choice.

DESCRIPTION OF THE PREFERRED EMBODIMENTS

The invention is now described in detail using FIGS. 1 through 5 for this purpose.

Figure 1:
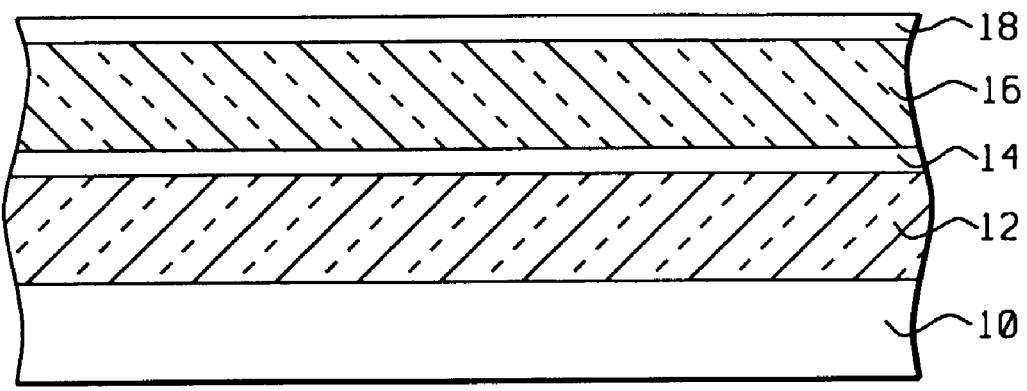
FIG. 1 is a cross section of a substrate over the surface of which have been deposited layers of dielectric, layers of etch stop material are part of the stack of layers.

Referring now specifically to the cross section shown in FIG. 1, there is shown a cross section of a semiconductor surface 10 such as the surface of a silicon substrate. Over the surface of substrate 10 have successively been deposited a lower layer 12 of insulating material such as IMD dielectric and an upper layer 16 of insulating material such as IMD dielectric. The two layers 12 and 16 are separated by a relatively thin layer 14 of etch stop material, a second layer 18 of etch stop material has been deposited over the surface of layer 16.

For the etch stop layers 14 and 18 one of the numerous available etch stop materials can be selected such as silicon nitride, nitride, carbide and composite films like oxide/carbide, oxide/nitride and the like.

The preferred etch stop materials of the invention for layers 14 and 18 are silicon nitride (SiN) and silicon carbide (Sic).

For the layers 12 and 16 a material that is typically applied as an Intra Level Dielectric (ILD) and Inter Metal Dielectric (IMD) can be selected. For these layers, preferably a low-k dielectric is selected, such as hydrogen silsesquioxane, HDP-FSG (high-density-plasma fluorine-doped silicate glass, fluorine-doped silicate glass (FSG), silicon dioxide ("oxide", doped or undoped) or silicon nitride ("nitride"), silicon oxynitride, fluoropolymer, parylene, polyimide, tetra-ethylortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

Figure 2:
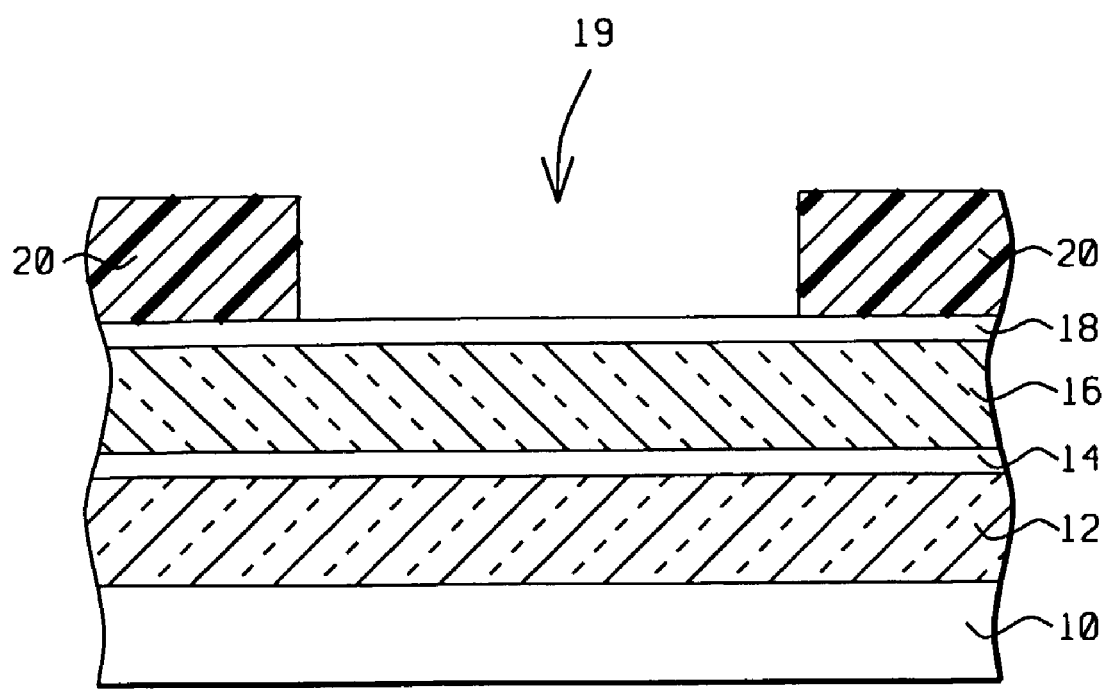
FIG. 2 shows a cross section of the substrate after a photoresist mask has been created over the surface of the last created layer of FIG. 1.

Next, FIG. 2, a mask 20 of etch resist material, preferably comprising photoresist, is created over the surface of layer 18 of etch stop material. The opening 19 that is defined in the layer 20 of etch resist material 20 exposes the surface of layer 18 over a surface area where a design requires that a semiconductor component is created, imbedded in layer 16 of low-k material. This desired requires a high-k dielectric material for its creation.

Figure 3:
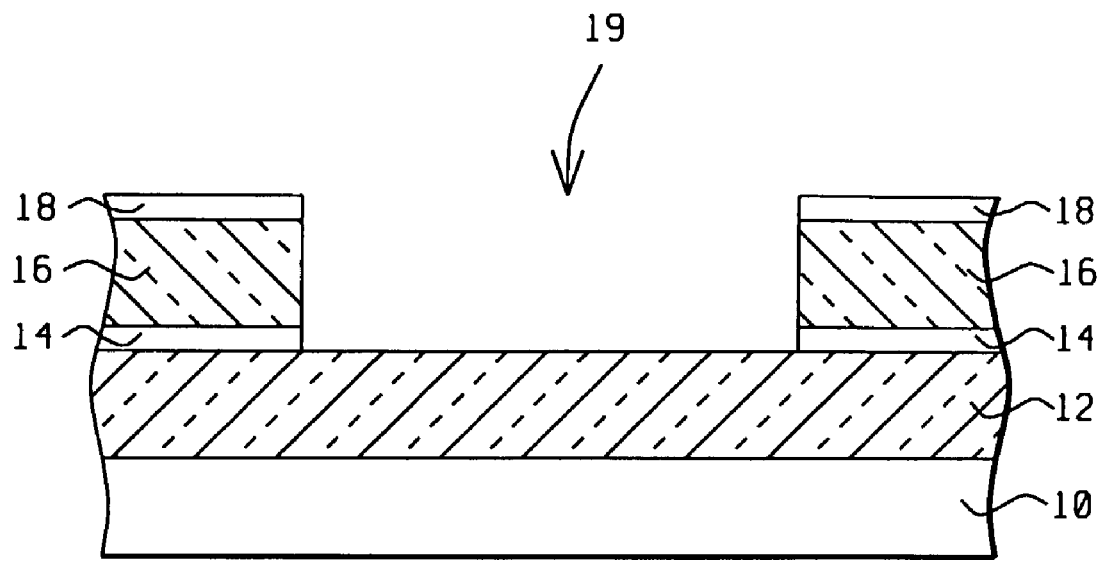
FIG. 3 shows a cross section of the substrate after etching of an upper layer of dielectric, creating an opening through this layer of dielectric.

The etch that has been prepared with the creation of the etch resistance mask 20, FIG. 2, is now performed removing, in accordance with the pattern of the etch resistant mask 20, the layers 18, 16 and 14 from the surface of the lower layer 12 of insulating material. The result of this etch are shown in cross section in FIG. 3, where the now patterned and etched layers 14, 16 and 18 remain as a stack of layers overlying the surface of the lower layer of insulating material 12. In the cross section that is shown in FIG. 3, the etch resistant mask 20, FIG. 2, has been removed from the surface of layer 18.

Figure 4:
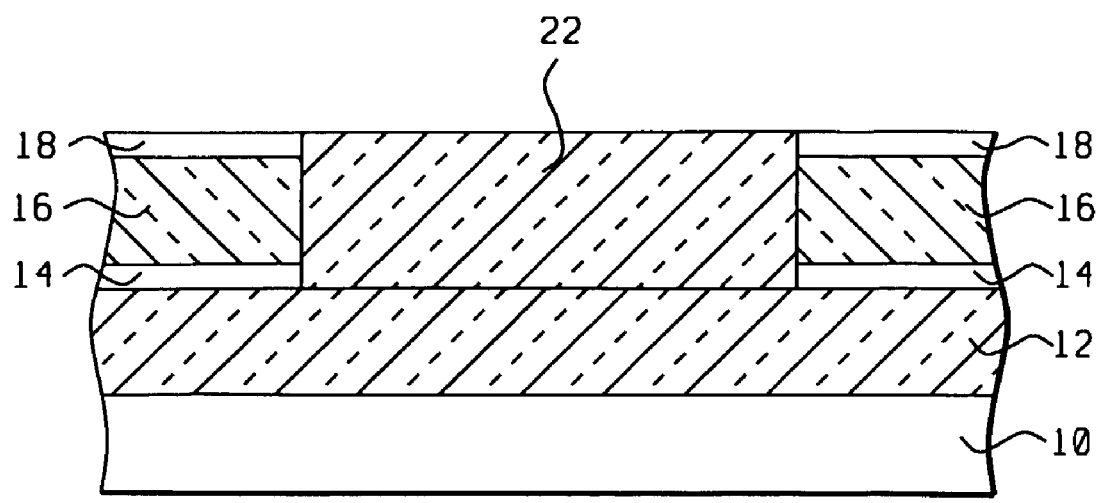
FIG. 4 shows a cross section of the substrate after the created opening has been filled with a dielectric of choice.

As a final step of the invention, as shown in the cross section of FIG. 4, the trench 19 (FIG. 3) is now filled with a layer 22 of high-k insulating material for purposes of creating a semiconductor component therein that requires a high-k insulating material for optimum performance thereof. The layer 22 can be blanket deposited over the surface of the structure that is shown in cross section in FIG. 3 after which excess material is removed from above the surface of layer 18 by methods of Chemical Mechanical Polishing, stopping on the surface of layer 18 and leaving trench 19 filled with high-k insulating material.

The material that is used for layer 22 of high-k insulating material can for instance be selected from the group consisting of oxide-nitride-oxide (ONO), SiN such as $Si_2O$, $Si_3N_4$, $Ta_xO_y$ such as tantalum pentoxide ($TaO_5$), $Hf_xO_y$, and the like.

The structure that is shown in cross section in FIG. 4 is now comprises a layer 16 of low-k insulating material and, at the same level as the layer 16 of low-k insulating material, a layer 22 of high-k insulating material.

Figure 5:
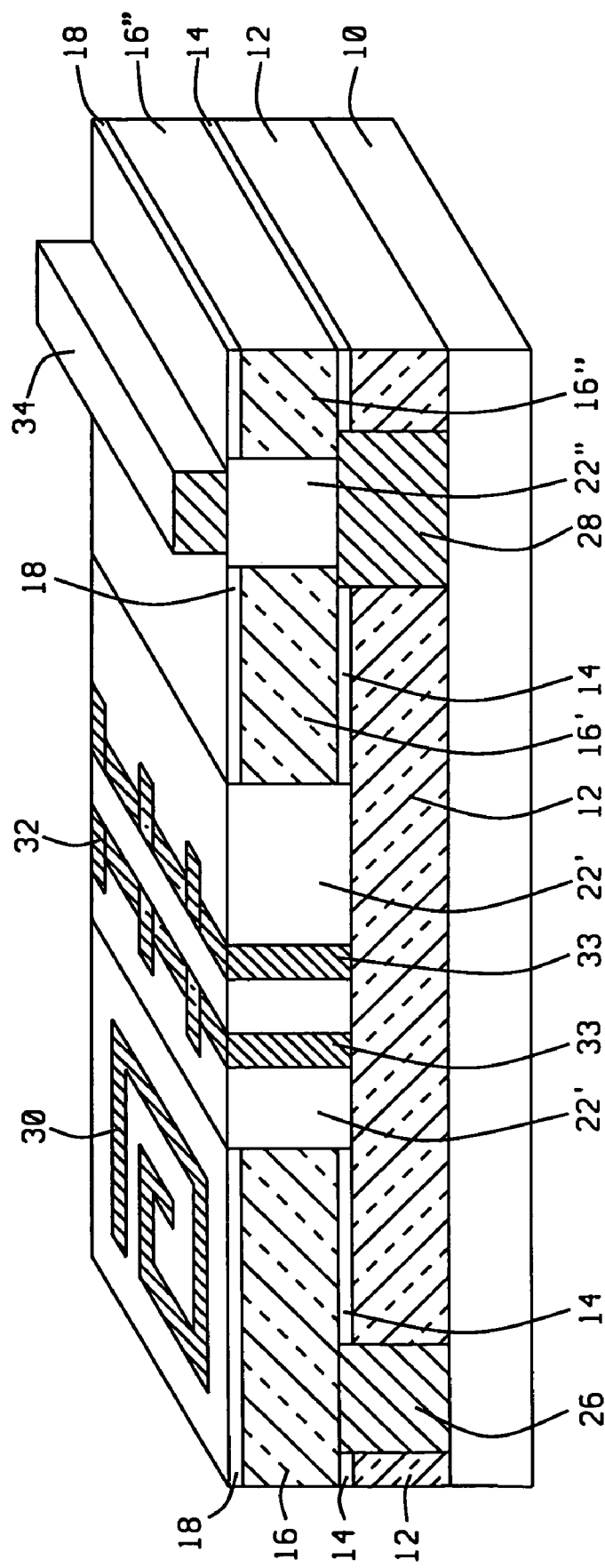
FIG. 5 shows a three dimensional view of an application of the invention.

As an example of the application of the invention, a three dimensional view of a number of semiconductor components is shown in FIG. 5.

Specifically highlighted in FIG. 5 are:

10, a semiconductor surface, preferably the surface of a substrate, over the surface of which the semiconductor components of the example have been created 12, a first layer of insulating material deposited over the surface of layer 10

14, a first layer of etch stop material deposited over the surface of layer 12

16, 16' and 16", three sections of a second layer of insulating material deposited over the surface of layer 14; layers 16, 16' and 16" are used for the creation of metal lines and interconnect traces therein or thereover; these metal lines and interconnect traces require a low-k insulating material which is provided by the material of layers 16, 16' and 16"

18, a second layer of etch stop material deposited over the surface of layer 16

22', a first layer of high-k insulating dielectric, which in the example shown serves for the creation of a lateral capacitor dielectric therein 22", a second layer of high-k insulating dielectric which in the example shown serves as a layer of capacitor dielectric for horizontal capacitor, whereby a first plate of a horizontal capacitor is element 28 and a second plate of the horizontal capacitor is element 34

26, a patterned and etch layer of metal, preferably comprising copper, that serves as a contact for an overlying inductor 30

28, a patterned and etch layer of metal, preferably comprising copper, that serves as a first electrode for an overlying capacitor 30, an inductor that has been created overlying the layer 16 of low-k insulating material in alignment with inductor contact point 26

32, a lateral capacitor that has been created using the high-k insulating layer 22'

33, the contacts to the lateral capacitor 32

34, the second plate of a horizontal capacitor of which element 28 is the first plate and layer 22" of high-k insulating material is the capacitor dielectric.

It is clear that the three dimensional view of FIG. 5 serves as an example from which it can be derived that the invention provides for the mixed creation of semiconductor device elements in one plane even for device elements that require insulating materials of both high-k and low-k dielectric constants. The example shown in FIG. 5 illustrates the creation of a horizontal capacitor, a lateral or vertical capacitor and interconnect traces in one plane while the dielectric constant of this plane is locally selected so that an inductor can be provided over the surface of this plane. Specifically, the inductor is created overlying a low-k dielectric, the lateral capacitor is created in a high-k dielectric, the horizontal capacitor is created using a high-k capacitor dielectric. All of these components are created in a plane in which also networks of interconnect traces have been created which typically required a low-k dielectric for optimum performance.

The invention is equally applicable to cases where layer 12, FIGS. 1 through 5, is omitted and where therefore a layer of dielectrics, having different dielectric constants, is created directly over the surface of the substrate. A layer of etch stop material is in this case first deposited directly over the surface of a substrate, the layer of dielectric is deposited over this layer of etch stop material. Interconnect metal with overlying bond pads that are in contact with the interconnect metal can be created in this layer of dielectric, the interconnect metal of this layer is further electrically connected with the semiconductor devices that have been created over the surface of the substrate.

While the examples that have been used in the FIGS. 1 through 5 show the application of two overlying layers of dielectric material, separated and covered by a layer of etch stop material, these two layers of dielectric material can readily be expanded to a larger number of layers without affecting the invention. Some of the additional layers may be used for the creation of regions in the plane thereof that have different electrical characteristics but not all of these additional layers need to be used for this purpose. The invention therefore provides a method for the creation of complex, multi-layer structures whereby the specific requirements of each of the components that are part of the structure can be individually addressed and provided for. Components that are part of the structure are thereby not limited in their creation to being created in one plane and are not restricted to one plane by requirements of insulating material that is a critical part of the created component.

It can be stated in summary that the invention provides a method for the creation in one plane of electrical components which require dielectrics having non-identical dielectric constants for their creation.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creation of layers of dielectric, comprising:
   providing a substrate, said substrate having been provided with semiconductor devices;
   depositing a stack of layers over a layer of interconnect metal, said stack of layers comprising:
   (i) a lower layer of etch stop material; and
   (ii) a first upper layer of dielectric having a first dielectric constant;
   patterning said stack of layers, creating an opening through said first upper layer of dielectric and said lower layer of etch stop material;
   creating in one plane a patterned first upper layer of dielectric having said first dielectric constant and a patterned second upper layer of dielectric having a second dielectric constant by filling said opening created through said first upper layer of dielectric and said lower layer of etch stop material with a second upper layer of dielectric having said second dielectric constant, said patterned first upper layer of dielectric being in direct contact with said second upper layer of dielectric; and
   creating a first component in or over said second upper layer of dielectric, said component being connected with said semiconductor devices provided over said substrate.

2. The method of claim 1, additionally creating interconnect metal with overlying bond pads connected therewith in or over said first upper layer of dielectric, said interconnect metal being connected with said semiconductor devices provided over said substrate.

3. The method of claim 1, said first dielectric constant and said second dielectric constant being different.

4. The method of claim 1, said patterning said stack of layers additionally comprising:
   (A) first steps, said first steps being performed prior to said patterning said stack of layers, said first steps comprising:
   (i) depositing a layer of etch stop material over said stack of layers; and
   (ii) creating an etch resist mask over said layer of etch stop material, said etch resist mask having an opening exposing said stack of layers where said opening is created through said stack of layers;
   (B) a second step, said second step being performed after said patterning said stack of layers, said second step comprising removing said etch resist mask.

5. The method of claim 4, said etch resist mask comprising photoresist.

6. The method of claim 2, additionally creating a second component overlying said interconnect metal, said second component being connected with said bond pads overlying said interconnect metal.

7. The method of claim 6, said second component comprising an inductor.

8. The method of claim 7, said inductor comprising a horizontal spiral inductor created over a low dielectric-constant dielectric.

9. The method of claim 1, said first component comprising a capacitor.

10. The method of claim 9, said capacitor comprising a horizontal capacitor.

11. The method of claim 9, said capacitor comprising a lateral capacitor.

12. The method of claim 9, said capacitor comprising a horizontal capacitor created in a high dielectric-constant dielectric.

13. The method of claim 9, said capacitor comprising a lateral capacitor created in a high dielectric-constant dielectric.

14. The method of claim 1, said first upper layer of dielectric comprising an Inter Metal Dielectric.

15. The method of claim 1, said layer of etch stop material being selected from the group of materials consisting of silicon nitride and silicon carbide.

16. A method for creation of layers of dielectric, comprising:
   providing a substrate, said substrate having been provided with semiconductor devices;
   creating a layer of interconnect metal with overlying bond pads connected therewith over said substrate, said layer of interconnect metal being connected with said semiconductor devices;
   depositing a stack of layers over said layer of interconnect metal, said stack of layers comprising:
   (i) a lower layer of etch stop material; and
   (ii) an first upper layer of dielectric having a first dielectric constant;
   patterning said stack of layers, creating an opening through said first upper layer of dielectric and said lower layer of etch stop material;
   creating in one plane a patterned first upper layer of dielectric having said first dielectric constant and a patterned second layer of dielectric having a second dielectric constant by filling said opening created through said first upper layer of dielectric and said lower layer of etch stop material with a second upper layer of dielectric having said second dielectric constant, said patterned first upper layer of dielectric being in direct contact with said second layer of dielectric; and creating a first component in or over said second upper layer of dielectric, said first component being connected with said layer of interconnect metal.

17. The method of claim 16, additionally creating interconnect metal with overlying bond pads connected therewith in or over said first upper layer of dielectric, said interconnect metal being connected with said bond pad.

18. The method of claim 16, said first dielectric constant and said second dielectric constant being different.

19. The method of claim 16, said patterning said stack of layers additionally comprising:
(A) first steps, said first steps being performed prior to said patterning said stack of layers, said first steps comprising:
(i) depositing a layer of etch stop material over said stack of layers; and
ii) creating an etch resist mask over said layer of etch stop material, said etch resist mask having an opening exposing said stack of layers where said opening is created through said stack of layers;
(B) a second step, said second step being performed after said patterning said stack of layers, said second step comprising removing said etch resist mask.

20. The method of claim 19, said etch resist mask comprising photoresist.

21. The method of claim 17, additionally creating a second component overlying said interconnect metal created in or over said first upper layer of dielectric, said second component being connected with said bond pads overlying said interconnect metal.

22. The method of claim 21, said second component comprising an inductor.

23. The method of claim 22, said inductor comprising an horizontal spiral inductor created over a low dielectric-constant dielectric.

24. The method of claim 16, said first component comprising a capacitor.

25. The method of claim 24, said capacitor comprising a horizontal capacitor.

26. The method of claim 24, said capacitor comprising a lateral capacitor.

27. The method of claim 24, said capacitor comprising a horizontal capacitor created in a high dielectric-constant dielectric.

28. The method of claim 24, said capacitor comprising a lateral capacitor created in a high dielectric-constant dielectric.

29. The method of claim 16, said first upper layer of dielectric comprising an Inter Metal Dielectric.

30. The method of claim 16, said layer of etch stop material being selected from the group of materials consisting of silicon nitride and silicon carbide.

31. A method for creation of layers of dielectric comprising:
providing a substrate, said substrate having been provided with semiconductor devices;
creating a layer of interconnect metal with overlying bond pads connected therewith over said substrate, said layer of interconnect metal being connected with said semiconductor devices;
depositing a stack of layers over said layer of interconnect metal, said stack of layers comprising:
(i) a lower layer of etch stop material; and
(ii) a first upper layer of dielectric having a first dielectric constant;
patterning said stack of layers, creating a multiplicity of openings through said first upper layer of dielectric and said lower layer of etch stop material;
creating in one plane a patterned first upper layer of dielectric having said first dielectric constant and a patterned second upper layer of dielectric having a second dielectric constant by filling said multiplicity of openings with a multiplicity of layers of dielectric having a multiplicity of dielectric constants, said patterned first upper layer of dielectric being in direct contact with said multiplicity of layers of dielectric having said multiplicity of dielectric constants; and
creating a first component in or over said multiplicity of layers of dielectric, said first component being connected with said layer of interconnect metal.

32. The method of claim 31, additionally creating interconnect metal with overlying bond pads connected therewith in or over said first upper layer of dielectric, said interconnect metal being connected with said bond pad provided over said layer of interconnect metal.

33. The method of claim 31, said first dielectric constant and a dielectric constant of each of said multiplicity of dielectric constants being different.

34. The method of claim 31, said patterning said stack of layers additionally comprising:
(A) first steps, said first steps being performed prior to said patterning said stack of layers, said first steps comprising:
(i) depositing a layer of etch stop material over said stack of layers; and
(ii) creating an etch resist mask over said layer of etch stop material, said etch resist mask having an opening exposing said stack of layers where said opening is created through said stack of layers;
(B) a second step, said second step being performed after said patterning said stack of layers, said second step comprising removing said etch resist mask.

35. The method of claim 34, said etch resist mask comprising photoresist.

36. The method of claim 32, additionally creating a second component overlying said interconnect metal created in or over said first upper layer of dielectric, said second component being connected with said bond pads overlying said interconnect metal.

37. The method of claim 36, said second component comprising an inductor.

38. The method of claim 37, said inductor comprising an horizontal spiral inductor created over a low dielectric-constant dielectric.

39. The method of claim 31, said first component comprising a capacitor.

40. The method of claim 39, said capacitor comprising a horizontal capacitor.

41. The method of claim 39, said capacitor comprising a lateral capacitor.

42. The method of claim 39, said capacitor comprising a horizontal capacitor created in a high dielectric-constant dielectric.

43. The method of claim 39, said capacitor comprising a lateral capacitor created in a high dielectric-constant dielectric.

44. The method of claim 31, said first upper layer of dielectric comprising an Inter Metal Dielectric.

45. The method of claim 31, said layer of etch stop material being selected from the group of materials consisting of silicon nitride and silicon carbide.

46. A method for creation of layers of dielectric comprising:
  providing a substrate, said substrate having been provided with semiconductor devices;
  depositing a stack of layers over a layer of interconnect metal, said stack of layers comprising:
  (i) a lower layer of etch stop material; and
  (ii) a first upper layer of dielectric having a first dielectric constant;
  patterning said stack of layers, creating a multiplicity of openings through said first upper layer of dielectric and said lower layer of etch stop material;
  creating in one plane a patterned first upper layer of dielectric having said first dielectric constant and a patterned second upper layer of dielectric having a multiplicity of dielectric constants by filling said multiplicity of openings with a multiplicity of layers of dielectric having said multiplicity of dielectric constants, said patterned first upper layer of dielectric being in direct contact with said multiplicity of patterned second upper layers of dielectric; and
  creating a first component in or over said multiplicity of layers of dielectric, said first component being connected with said semiconductor devices.

47. The method of claim 46, additionally creating interconnect metal with overlying bond pads connected therewith in or over said first upper layer of dielectric, said interconnect metal being connected with said semiconductor devices.

48. The method of claim 46, said first dielectric constant and a dielectric constant of each of said multiplicity of dielectric constants being different.

49. The method of claim 46, said patterning said stack of layers additionally comprising:
  (A) first steps, said first steps being performed prior to said patterning said stack of layers, said first steps comprising:
  (i) depositing a layer of etch stop material over said stack of layers; and
  (ii) creating an etch resist mask over said layer of etch stop material, said etch resist mask having an opening exposing said stack of layers where said opening is created through said stack of layers;
  (B) a second step, said second step being performed after said patterning said stack of layers, said second step comprising removing said etch resist mask.

50. The method of claim 49, said etch resist mask comprising photoresist.

51. The method of claim 47, additionally creating a second component overlying said interconnect metal created in or over said first upper layer of dielectric, said second component being connected with said bond pads overlying said interconnect metal.

52. The method of claim 51, said second component comprising an inductor.

53. The method of claim 52, said inductor comprising an horizontal spiral inductor created over a low dielectric-constant dielectric.

54. The method of claim 46, said first component comprising a capacitor.

55. The method of claim 54, said capacitor comprising a horizontal capacitor.

56. The method of claim 54, said capacitor comprising a lateral capacitor.

57. The method of claim 54, said capacitor comprising a horizontal capacitor created in a high dielectric-constant dielectric.

58. The method of claim 54, said capacitor comprising a lateral capacitor created in a high dielectric-constant dielectric.

59. The method of claim 46, said first upper layer of dielectric comprising an Inter Metal Dielectric.

60. The method of claim 46, said layer of etch stop material being selected from the group of materials consisting of silicon nitride and silicon carbide.

* * * * *

UNITED STATES PATENT AND TRADEMARK OFFICE
CERTIFICATE OF CORRECTION

PATENT NO. : 7,060,193 B2 Page 1 of 1
APPLICATION NO. : 10/189876
DATED : June 13, 2006
INVENTOR(S) : Yelehanka Ramachandramurthy Pradeep et al.

It is certified that error appears in the above-identified patent and that said Letters Patent is hereby corrected as shown below:

Title Page    line 1
In the Inventors, (75), delete first inventor, "Pradeep Yelhanka, Singapore (SG)" and replace with - - Yelehanka Ramachandramurthy Pradeep, Singapore (SG) - -.

Title Page    lines 3-4
In the Inventors, (75), delete fourth inventor "Jia Zhen, Singapore (SG)" and replace with - - Jia Zhen Zheng, Singapore (SG) - -.

Signed and Sealed this

Fifth Day of September, 2006

JON W. DUDAS
*Director of the United States Patent and Trademark Office*